United States Patent [19]

Itaba et al.

[11] 4,411,763

[45] Oct. 25, 1983

[54] SPUTTERING APPARATUS

[75] Inventors: Takeshi Itaba; Akio Nishiyama, both of Tokyo; Noribumi Kikuchi, Ohmiya; Takayuki Shingyoji, Ohmiya; Yuzo Ohsawa, Ohmiya, all of Japan

[73] Assignee: Mitsubishi Kinzoku Kabushiki Kaisha, Tokyo, Japan

[21] Appl. No.: 411,003

[22] Filed: Aug. 24, 1982

[30] Foreign Application Priority Data

Aug. 27, 1981 [JP] Japan ................................ 56-134502

[51] Int. Cl.$^3$ .................................................. C23C 15/00
[52] U.S. Cl. ................................. 204/298; 204/192 R
[58] Field of Search ................................ 204/192, 298

[56] References Cited

U.S. PATENT DOCUMENTS

| | | | |
|---|---|---|---|
| 3,576,729 | 4/1971 | Sigournay | 204/298 |
| 3,598,710 | 8/1971 | Davidse | 204/298 |
| 3,787,312 | 1/1974 | Wagner et al. | 204/298 |
| 4,107,350 | 8/1978 | Berg et al. | 204/298 |
| 4,128,466 | 12/1978 | Harding et al. | 204/298 |
| 4,151,059 | 4/1979 | Kuehnle | 204/298 |
| 4,178,877 | 12/1979 | Kudo | 204/298 |
| 4,252,626 | 2/1981 | Wright et al. | 204/298 |
| 4,362,632 | 12/1982 | Jacobs | 204/298 |

OTHER PUBLICATIONS

Putner et al, Electronics Equipment News, Apr.–Jun. 1968, pp. 2–19.

*Primary Examiner*—Arthur P. Demers
*Attorney, Agent, or Firm*—Cushman, Darby & Cushman

[57] ABSTRACT

A sputtering apparatus for coating by the use of a target cathode within a vacuum chamber an article to be treated which is held on an article holding means within the vacuum chamber. The target cathode is of a tubular skeleton structure and is disposed so as to surround the article holding means.

14 Claims, 17 Drawing Figures

SPUTTERING APPARATUS

BACKGROUND OF THE INVENTION

The present invention relates to a sputtering apparatus for coating a film of a metal, hard substance and the like upon an article such as cutting tool, wear-resistant piece, and the like.

Conventionally, in order to improve characteristics of cutting tools and wear resistant members such as a bearing, a coating or film of a metal, hard substance and the like has been formed on them by means of an ion-plating process and a physical vapor deposition process such as an activated reactive deposition process.

In one conventional sputtering method, a target is disposed within a vacuum chamber, and an article or substrate to be treated is placed below the target within the vacuum chamber. The target material is vapor deposited on a surface of the article in a well known manner. A bias sputtering method is also known in the art by which a deposited coating of a higher density is formed on an article. A magnetron sputtering method is also known in which a magnetron target of either a cylindrical or a planar type is used. With this method, the deposition speed is increased. However, in the case where cross-sectionally square throw-away tips of cemented carbide (size: 7 mm width×7 mm length×3 mm thickness to 20 mm width×20 mm length×200 mm thickness) which require a coating of uniform thickness on eight apexes thereof, drills, hob cutter of high speed steel (200 mm diameter×200 mm length), and wear-resistant members of various shapes such as a bearing and a roll are coated with a coating layer of a uniform thickness, using the above conventional sputtering methods, the following disadvantages have been encountered:

(a) The deposited coating exhibits directional properties, and this is marked particularly when the physical vapor deposition method is employed. Therefore, the coating of uniform thickness is not applied to an article or substrate of complicated shape.

(b) When a large number of articles are subjected to deposition coating, the deposition rate and the temperature of the substrate can not be suitably controlled. Therefore, the deposition operation can not be carried out efficiently.

SUMMARY OF THE INVENTION

It is therefore an object of this invention to provide a sputtering apparatus which enables a coating of hard substance or metal to be easily and efficiently applied uniformly to an article with high adhesion strength regardless of the shape of the article, and which is easy in maintenance.

According to the present invention, there if provided a sputtering apparatus for applying a coating to an article which apparatus comprises a vacuum chamber; a holding means disposed within the vacuum chamber for holding the article; and a target cathode being of a tubular skeleton structure disposed in surrounding relation to the article holding means.

DETAILED DESCRIPTION OF THE PREFERRED EMBODIMENTS

Figure 1A:
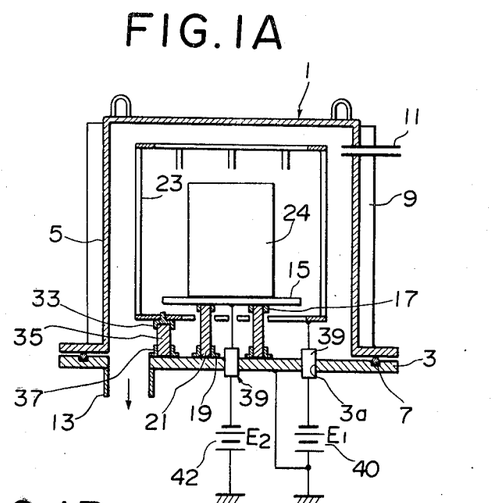
FIG. 1A is a schematical vertical section of one embodiment of the present invention.
Figure 1B:
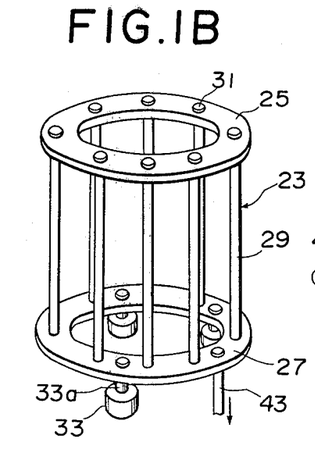
FIG. 1B is an enlarged perspective view of the target cathode in FIG. 1A.
Figure 1C:
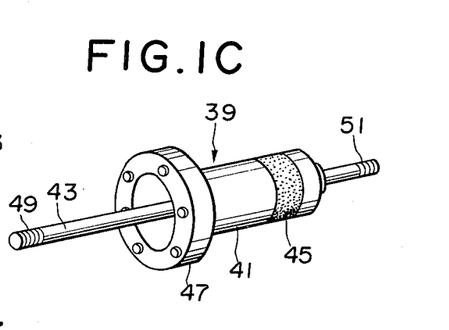
FIG. 1C is an enlarged perspective view of the lead-plug in FIG. 1A.

Referring to FIGS. 1A and 1B, reference numeral 1 designates a vacuum chamber of stainless steel, which comprises a base plate 3 and a cylindrical evacuable enclosure 5 positioned on the base plate 3 through an O-ring 7 for air tight contact. The evacuable enclosure 5 is provided at its outer peripheral wall with a water jacket 9 for cooling and with a gas inlet 11 for admitting gas thereinto, the gas inlet being connected to a gas supply (not shown). The base plate 3 is provided with a gas outlet 13 which is connected to a vacuum pump system (not shown) for evacuating the vacuum chamber 1. Mounted centrally on the base plate 3 is a substrate holder 15 of a disc shape made of SUS stainless steel, on the lower surface of which are fixedly attached several sockets 17 around the center of the holder 15. To the upper surface of the base plate 3 and around the center of the latter there are fastened corresponding sockets 19 by suitable fastening means such as screws. The sockets 17 and the corresponding sockets 19 constitute several pairs. A ceramic support bar 21 is removably fitted at its upper end into each socket 17 and at its lower end into the other socket 19 of each pair, so that the substrate holder 15 is supported over the base plate 3 so as to be electrically insulated from the base plate. Around the holder 15 and within the vacuum chamber 1, there is provided a target cathode 23 of a cylindrical skeleton structure with its axis being vertically disposed so that it surrounds the holder 15 and a substrate 24 placed on that substrate holder. As clearly shown in FIG. 1B, the target cathode 23 includes an upper ring 25, a lower ring 27, and a plurality of target elements 29 of a round bar, eight target elements in this embodiment. The target elements 29 and upper and lower rings 25 and 27 are of titanium in this embodiment. Each target elements 29 is jointed parallel at its opposite ends to the upper and lower rings 25 and 27 by means of machine screws 31 of titanium of which shanks pass through the rings 25 and 27 so that the target elements 29 are erected on a closed curve, a circle in this embodiment, in a substantially equispaced relation. In FIG. 1B only machine screws 31 which fasten the upper ends of the target elements to the upper ring are shown. Several sockets 33, three sockets in this embodiments, having each a threaded shank 33a are attached to the lower ring 27 by threading the shanks 33a with that lower ring. On the other hand, corresponding three sockets 37 (only one of which is shown) are attached to the upper surface of base plate 3 within the vacuum chamber 1 around the center of the base plate 3 by suitable fastening means such as screws. One end of a ceramic supporting bar 35 is removably fitted into each socket 33 and the other end thereof is also removably fitted into a corresponding socket 37. Thus, the target cathode 23 is disposed within the vacuum chamber 1 so that it is electrically insulated from both vacuum chamber 1 and the substrate holder 15. The target cathode 23 and holder 15 are connected through conventional lead plugs 39 to D.C. power sources 40 and 42, and thereby negative D.C. voltages $E_1$ and $E_2$ are applied thereto respectively. As shown in FIG. 1C, the lead plug 39 includes a plug body 41 and a lead rod 43 of stainless steel or copper, the lead rod 43 passing through a ceramic portion 45 of the plug body 41. A flange 47 of the plug body 41 is fastened by means of screws to the lower surface of the base plate 3 at the periphery of a hole 3a formed through the base plate 3 through a O-ring (not shown) for hermetical seal. In this event the lead rod 43 spacedly passes through the hole 3a. The inner end 49 of lead rod 43 of lead plug 39 for power supply $E_1$ is threaded with the lower ring 27 of target cathode 23 as shown in FIG. 1B and the outer end 51 thereof is electrically connected to a negative terminal of power supply 40, of which positive terminal is grounded. On the other hand, the inner end 49 of lead rod 43 of the other lead plug 39 for power supply 42 is threaded with substrate holder 15 and the outer end thereof is electrically connected to a negative terminal of power supply 42, of which positive terminal is grounded. The base plate 3 is grounded and therefore acts as an anode. The screws 31 and the sockets 33 are made of the same material as the target element.

The target cathode may comprise a hollow tubular member having a number of apertures formed through its peripheral wall. Also, the target cathode may be of the tubular skelton structure having a plurality of elongated target elements joined together to form a latticework.

The advantages of the sputtering apparatus shown in FIGS. 1A and 1B are as follows:

(a) As described above, the cathode target 23 comprises at least four elongated target elements 29 such as bars, pipes and plates, joined together parallel on a closed curve in substantially equi-spaced relation to form the tubular skelton sturcture which surrounds the substrate 24. Thus, since the target elements surrounds the substrate, titanium atoms, titanium ions and argon ions are applied by the glow discharges uniformly to the surface of the substrate to form the deposited layer of uniform thickness thereon. In addition, the substrate can be uniformly heated both by the radiant heat of the target elements and the glow discharges of the target elements. The closed curve mentioned above may have any suitable shape such as a circular shape and a polygonal shape.

(b) The target elements are spaced from one another at an equal interval of 5 to 100 mm. With this arrangement, the dispersion of the radiant heat of the target elements and the glow discharges can be suitably controlled so that the temperature of the substrate can be controlled. This temperature control is important. If the temperature of the substrate serving as a cutting blade or a wear-resistant member becomes excessively high during the deposition, its properties are adversely affected. More specifically, if the substrate is made of high speed steel and is heated to above a tempering temperature (usually, 550° to 750° C.), the substrate becomes soft or deformed. And, if the substrate is made of cemented carbide and is heated to above 800° C., a diffusion layer is formed on the surface of the substrate immediately adjacent to the deposition coating so that its toughness is lowered. On the other hand, if the coating layer is deposited on the substrate at an excessively low termperature, the strength of adhesion between the substrate and the coating is lowered. One method of lowering the temperature of the substrate is to reduce a voltage applied to the target cathode to restrain the glow discharges. However, this method is disadvantageous since when the voltage applied to the target cathode is reduced, the deposition rate is extremely lowered. In addition the deposited coating is frequently subjected to morphological change, and its density becomes low. Therefore, it is necessary to increase the voltage applied to the target cathode as high as possible to activate the glow discharges and to maintain the temperature of the substrate at below the softening temperature and at below the temperature at which the diffusion layer may be created. Even if many substrates or articles are to be treated, variations in the temperature of the substrate and unevenness in the coating thickness must be avoided. In order to achieve this, it will suffice to provide the target cathode of the tubular skelton structure having at least four target elements, such as bars, pipes and plates, equidistantly spaced from one another at an interval of 5 to 100 mm and disposed in surrounding relation to the substrate.

If the target cathode 23 has less than 4 target elements, the target elements can not sufficiently surround the substrate, so that it becomes difficult to deposit a coating of uniform thickness on the substrate. The interval between each adjacent target elements should be in the range of about 5 to about 100 mm. If this interval is less than 5 mm, the radiant heat due to the glow discharges are not sufficiently dispersed to the outside of the target cathode so that the temperature of the substrate is unduly increased to adversely affect it. Further, the target elements excessively interfere with one another, so that it is difficult to achieve proper glow discharges. On the other hand, if the interval exceeds 100 mm, the glow discharges are excessively reduced and can not surround the substrate uniformly so that it becomes difficult to deposit a coating of uniform thickness on the substrate, and besides, the reaction temperature is unduly lowered so that the strength of adhesion between the deposited coating and the substrate is lowered.

The distance between the target cathode and the substrate should preferably be in the range of about 10 to about 100 mm. If this distance is less than 10 mm, the deposition rate is too high, and the substrate is liable to be adversely effected by the radiant heat. As a result, the deposition operation can not be controlled in a stable manner. On the other hand, if the distance exceeds 100 mm, the deposition rate is unduly lowered.

In operation, substrate 24 is placed on substrate holder 15 and then evacuable enclosure 5 is positioned on base plate 3 to form vacuum chamber 1, after which that chamber 1 is evacuated to a predetermined vacuum level by actuating the vacuum pump system. A mixture gas of a discharge-sustaining gas such as argon gas, hydrogen gas or the like and reactive gas such as of nitrogen, methane, acetylene, carbon monoxide, carbon dioxide, oxygen or the like is introduced from the gas supply through gas inlet 11 into the vacuum chamber 1 until the mixture gas in the vacuum chamber reaches a predetermined pressure. Then, predetermined negative potentials $E_1$ and $E_2$ are applied to target cathode 23, and substrate 24 which is in an electrical contact with substrate holder 15, respectively, to generate glow discharges whereby sputtering is performed, and the surfaces of substrate 24 are coated with a thin layer of titamiun or a hard substance. The substrate 24 may be subjected to ion-etching in an atmosphere of argon gas, hydrogen gas or the like before the deposition operation to thereby enhance the strength of bonding between the substrate and the coating layer.

Metal which is used in the present invention for target cathode 23 may include for example that in group IVa such as Ti, Zr, Hf, group Va such as V, Nb, Ta, and group VIa such as Cr, Mo, W, Al, and Cu. The hard substance described above which is used in the present invention may include for example carbide, nitride, and carbide of the above-listed metals, and further include carbo-nitride of the above metals, oxy-carbo-nitride of the above metals, and aluminum oxide.

Figure 2A:
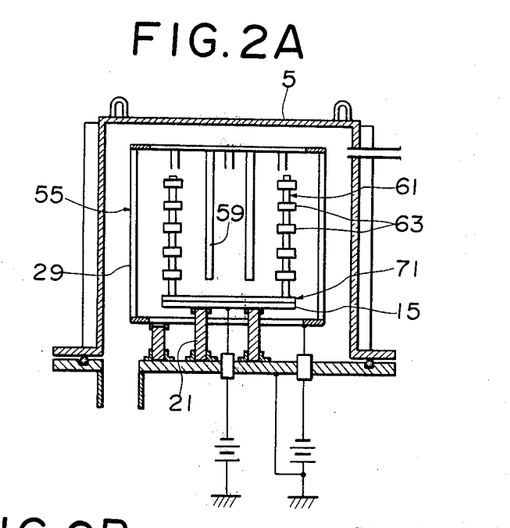
FIG. 2A is a schematical vertical section of a modified form of the cathode sputtering apparatus in FIG. 1A.
Figure 2B:
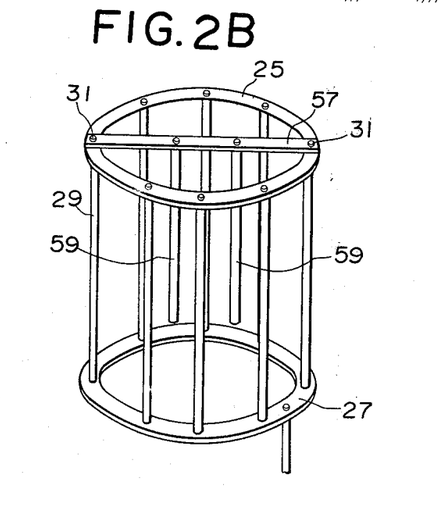
FIG. 2B is an enlarged perspective view of the target cathode in FIG. 2A.
Figure 2C:
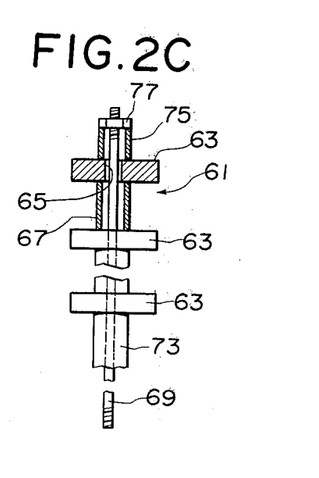
FIG. 2C is a side view partly in section of the substrate assembly in FIG. 2A.

Referring to FIG. 2A there is illustrated a modified form of the sputtering apparatus in FIGS. 1A and 1B suitable for coating a large number of relatively small substrates. Used in this modification is a target cathode 55 in which an elongated supporting bar 57 extends diametrically over the upper ring 25 of the target cathode 55 in FIG. 1B and is fastened at its opposited ends thereto by machine screws 31, and two target elements 59 and 59 depend from the supporting bar 57 by fastening the upper ends thereof to the latter with machine screws. The supporting bar 57 and target elments 59 are of the same material as target element 29. On the substrate holder 15 there is placed a support disc 71 at the peripheral portion of which a plurality of substrate assemblies 61 are vertically disposed at equal angular intervals. As clearly seen from FIG. 2C, the assembly 61 comprises several substrates 63 (five in this modification) such as throw-away tip each having a center hole 65 formed therthrough, tubular spacers 67 of stainless steel positioned between the substrate 63, and a connecting rod 69 of stainless steel passing through the substrates 63 and spacers 67. The lower end portion of the connecting rod 69 is provided with a bottom spacer 73 of stainless steel fitted therearound and the lower end is threaded into the peripheral portion of the upper surface of the support disc 71. On the other hand, a top spacer 75 is fitted around the upper end portion of connecting rod 69 and is secured by a nut 77 threaded with the upper end of connecting rod 69.

In operation, after the supporting disc 71 is placed on the holder 15 so that an electrical connection is made therebetween, target cathode 55 is placed in position so that the substrate assemblies 61 are located between target elements 29 and 59 as shown in FIG. 2A. Then, the assemblies 61 and target cathode 55 are covered with evacuable enclosure 5, after which the substrates 63 are subjected to the above-described sputtering treatment. With the construction of this modification, a coating layer of uniform thickness and adhesion strength is formed on the substrate 63.

Figure 3A:
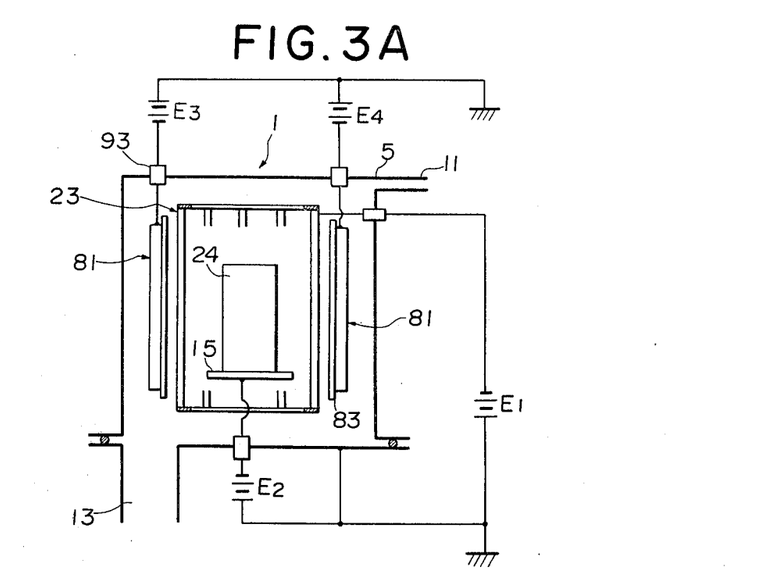
FIG. 3A is a schematical vertical section of another embodiment of the present invention.
Figures 3B, 3C:
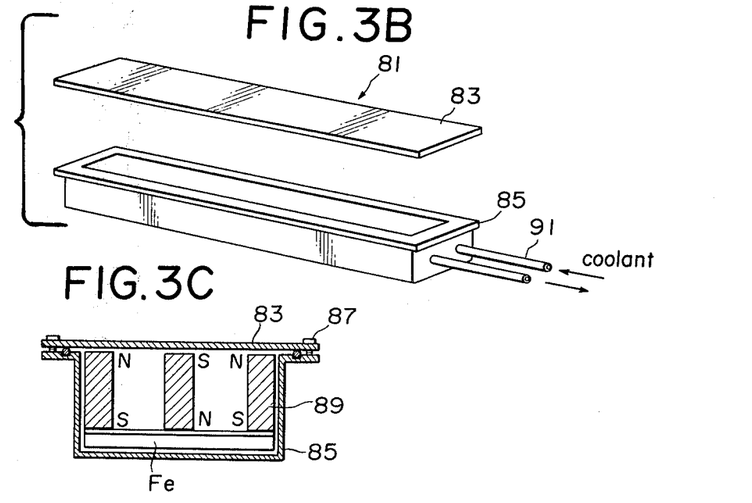
FIG. 3B is an exploded view of the planar-type magnetron target used in the cathode sputtering apparatus in FIG. 3A.
FIG. 3C is a cross sectional view of the planar-type magnet electrode in FIG. 3B.

On the outside of the target cathodes 23 and 55, there may be opposedly disposed at least one pair of magnetic filed generating means such as conventional planar-or cylindrical-type magnetron targets in a substantially equispaced relation. In FIG. 3A, a pair of well-known planar-type magnetron targets 81 are opposedly disposed outside the target cathode 23 shown in FIG. 1A and within the vacuum chamber 1. In FIGS. 3B and 3C, the planar-type magnetron target 81 includes a rectangular target plate 83 of titanium which is hermetically fastened to an opening of a casing 85 of stainless steel by screws 87 of titanium. The casing 85 incorporates permanent magnets 89 therein and is provided with conduits 91 which introduce coolant into the magnetron target and also serves as electrical lead. The conduits 91 are supported by and pass through a lead plug 93 of a tubular type similar in function to that shown in FIG. 1C, and is connected to an outer coolant source (not shown). The conduits 91 are also connected to a D.C. power supply and thereby negative potentials $E_3$ and $E_4$ are applied to the magnetron targets 81. As seen from FIG. 3A, the magnetron targets 81 are disposed so that the target plates 83 face each other. The provision of the magnetron targets 81 will largely increase deposition rate of substrates 24 and enable a coating layer of uniform thickness and high adhesion strength to be positively formed thereon.

Figure 3D:
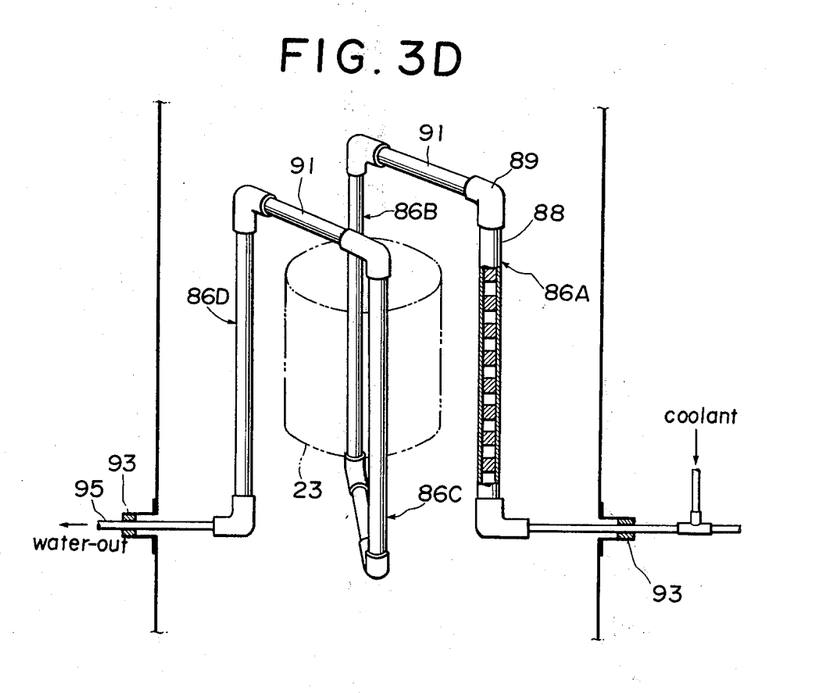
FIG. 3D is a perspective view illustrating an arrangement of cylindricaltype magnetron electrodes which may be used in the cathode sputtering apparatus in FIG. 3A in place of the planar-type magnet electrode.

FIG. 3D illustrates continuously-jointed cylindrical-type magnetron target 86 which incorporates a plurality of cylindrical permanent magnets in a pipe 88 of the same material as target element 29, titanium in this embodiment. Four targets 86A, 86B, 86C, and 86D are connected in series with L-type connectors 89 and conduits 91 of stainless steel so that they are vertically disposed at equal angular intervals. The lower end of target 86A is connected through a lead plug 93 of a tubular type similar in function to that in FIG. 1C to a coolant supply (not shown) and a D.C. power supply (not shown) for applying a negative potential to the four cylindrical-type magnetron targets. The coolant which has been supplied from the coolant supply and passed through the four targets issues out of a conduit 95 of stainless steel which passes through lead plug 93 fastened to the side wall of the evacuable enclosure. The target cathode 23 is disposed inside the continuous structure of target 86 as shown by the phantom line in FIG. 3D. The target cathode 23 may be located at any position near the magnetron target 86.

Figure 4A:
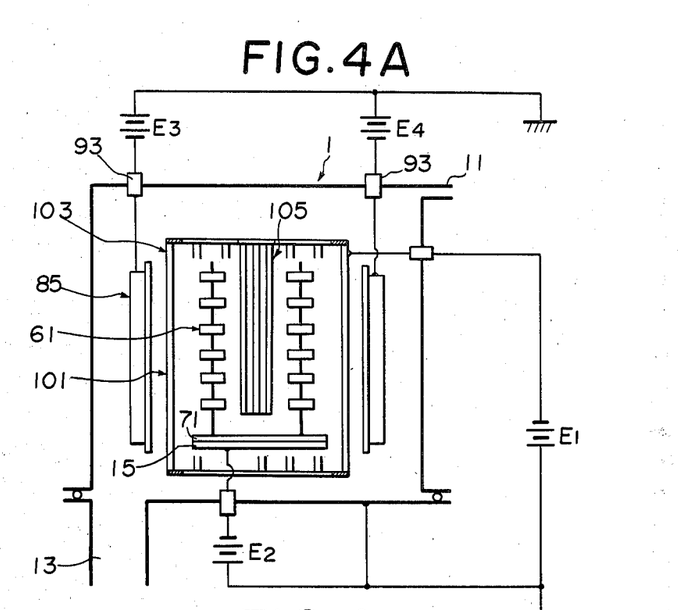
FIG. 4A is a schematical vertical section of a modified form of the cathode sputtering apparatus in FIG. 3A.
Figure 4B:
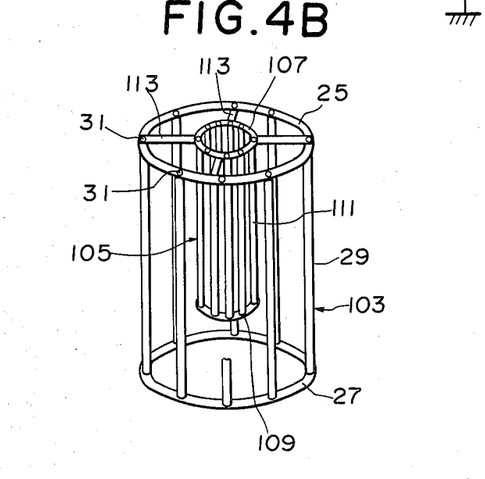
FIG. 4B is an enlarged perspective view of the target cathode in FIG. 4A.

In FIG. 4A, there is illustrated a modified form of the sputtering apparatus shown in FIG. 3A, in which a target cathode 101 comprises an outer target 103 of the same structure as the target cathode 23 in FIG. 1A and FIG. 4B and an inner target 105 concentrically disposed within outer target 103. The inner target 105 includes a top ring 107, a bottom ring 109, and a plurality of target elements 111, opposite ends of which are fastened by machine screws of titanium to the top and bottom rings 107 and 109 so that the target elements 111 are disposed in a parallel and equi-spaced relation to form a cylindrical skeleton structure. The top ring 107 is jointed to upper ring 25 through four target elements 113 by means of machine screws 31. All the members of the inner and outer targets 103 and 105 are of titanium. This modification applies a coating layer of uniform thickness and adhesion strength onto substrates 63.

Figure 5:
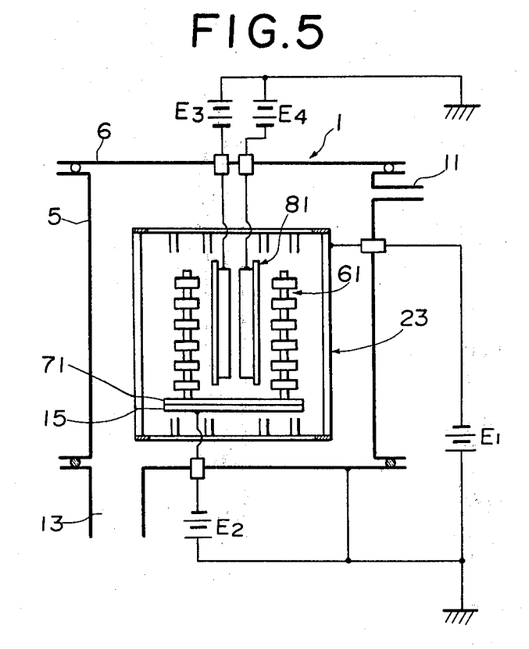
FIG. 5 is a schematical vertical section of a still another embodiment of the present invention.

In FIG. 5 there is shown a modified form of the sputtering apparatus shown in FIG. 2A, in which target cathode 23 is used in place of target cathode 55, and a plurality of inner planar-type magnetron targets 81 (two targets in this embodiment) shown in FIG. 3A depend from the ceiling 6 of evacuable enclosure 5 and are positioned within the array of substrate assemblies 61 so that the target plate 83 of each target 81 faces corresponding assembly 61. The targets 81 are connected to an outer electric source so that negative potentials $E_3$ and $E_4$ are applied thereto. A cylindrical-type magnetron target may be used in place of the planar-type magnetron target.

Figure 6:
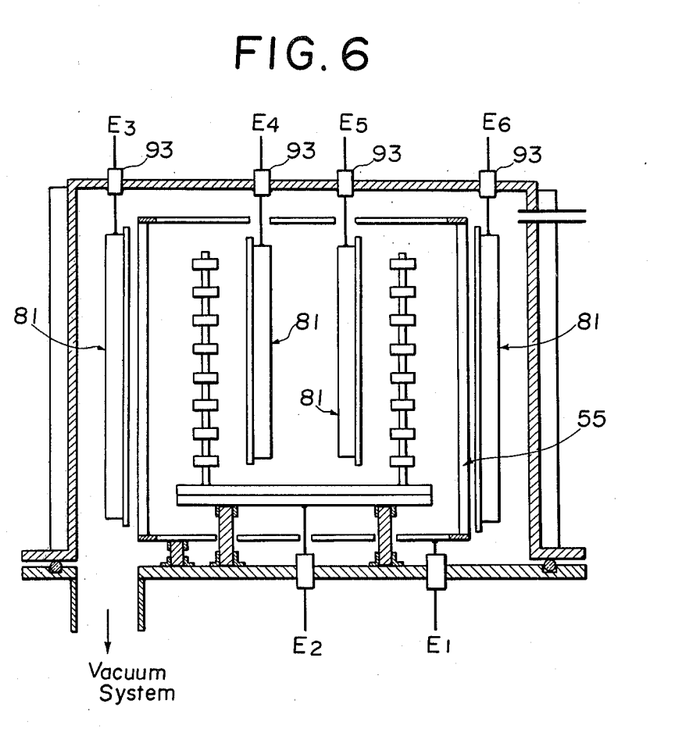
FIG. 6 is a schematical vertical section of a modified form of the sputtering apparatus in FIG. 5.

A modified sputtering apparatus shown in FIG. 6 differs from the sputtering apparatus in FIG. 5 in that a pair of outer planar-type magnetron targets 81 of the same construction as in FIG. 3B are disposed outside the target cathode 55 in the same manner as in FIG. 3A. In the modifications shown in FIGS. 5 and 6 the deposition rate is largely increased.

Figure 7A:
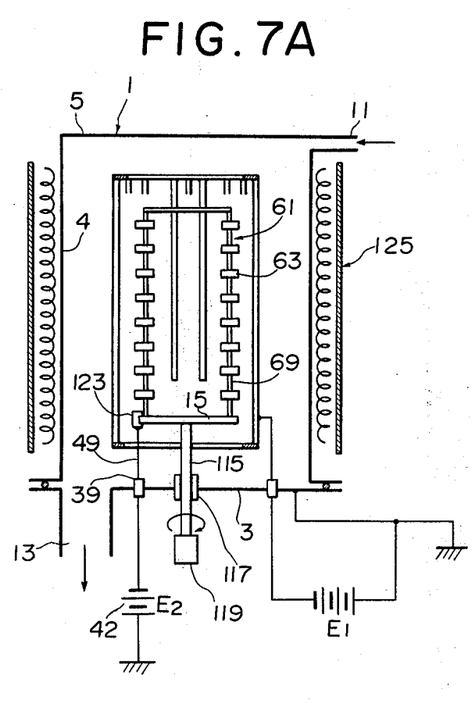
FIG. 7A is a schematical vertical section of a further modification of the sputtering apparatus in FIG. 2A.
Figure 7B:
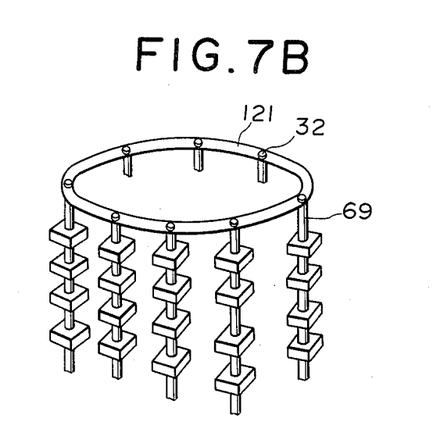
FIG. 7B is a fragmentary perspective view of the substrate assembly.
Figure 7C:
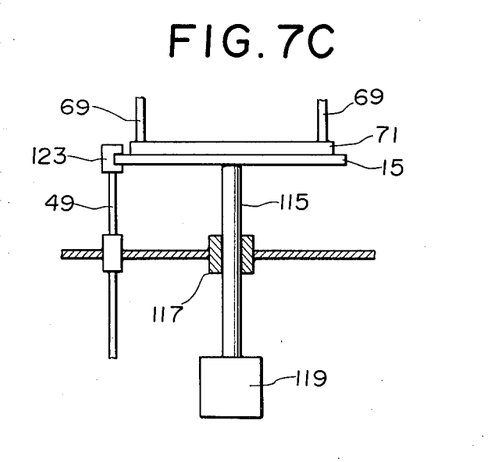
FIG. 7C is a fragmentary enlarged view of the sputtering apparatus in FIG. 7A.

FIG. 7A illustrates a modified form of the sputtering apparatus shown in FIG. 2A, in which a shaft 115 extends downward from substrate holder 15, which is not held by supporting bar 21, and passes through the base plate 3 where it is rotatably and hermetically carried by a well-known thrust bearing 117. The outer end of the shaft 115 is coupled to a reduction gear 119 which is connected to an electric motor (not shown). The connecting rod 69 of each assembly 61 is threaded at its lower end directly into the peripheral portion of the upper surface of holder 15. As shown in FIG. 7B, the upper end of each connecting rod 69 is fastened to a connecting ring 121 of stainless steel by machine screws 32. The substrate holder 15 contacts at its periphery a brush 123 of titanium-coated stainless steel, which is connected to and supported by lead rod 49 of lead plug 39, which is in turn connected to D.C. power supply 42. Thus, when the holder 15 is rotated, brush 123 makes an electrical contact with the holder 15 whereby a negative potential $E_2$ is applied to each substrate 63. With this construction, the thickness of coating layer formed becomes more uniform by rotating the substrate 63 than in the preceding embodiments of the present invention. In addition, the evacuable chamber 5 is provided at its outer peripheral wall 4 with a conventional electric heater 125, which enables impurities or adsorpted gases within the vacuum chamber 1 to be removed and assists the temperature control of the inside of the vacuum chamber 1, whereby the sputtering process is smoothened.

In the embodiments described above, the magnetic field generating means may be vertically disposed between target cathode 23, 55 and substrate 24, 63 on substrate holder 15, whereby deposition rate is increased.

EXAMPLE 1

Use was made of the sputtering apparatus shown in FIG. 2A, and a coating layer of TiN was formed on forty throw-away tips of cemented carbide (SNGA 120408 or JISK 10 for cutting tool by the use of nitrogen gas as an active gas and argon gas as a discharge sustaining gas. The tips were 12.7 mm wide, 12.7 mm long and 4.76 mm thick. The target cathode 55 used was of a cylindrical skeleton shape 200 mm high, and included eight titanium target elements 29 of 8 mm diameter, opposite ends of which were fastened at intervals of 30 to 35 mm to titanium upper and lower rings 25 and 27 of 120 mm outer diameter by means of titanium machine screws 31. Used as an inner cathode were two titanium target elements 59 of 8 mm diameter of which upper ends were fastened to supporting bar 57 of titanium by titanium screws 31. The sputtering was carried out to form a coating layer of 2 μm thickness under the conditions below.

target cathode voltage $E_1$: −2.0 kv
substrate voltage $E_2$: −0.15 kv
Ar partial pressure: $2 \times 10^{-2}$ torr
$N_2$ partial pressure: $1 \times 10^{-2}$ torr
treatment time: 2 hours
substrate temperature when the sputtering was completed: 780° C.

The coating layer formed was uniform in thickness and high in adhesion strength.

EXAMPLE 2

The sputtering apparatus substantially shown in FIGS. 4A and 4B was used and a coating layer of titanium was formed on twenty test pieces of ISO. R683/IC 45e or AISI 1045 (JIS.S45C) constituting four substrate assemblies 53, each test piece being 20 mm wide, 50 mm long, and 5 mm thick. The target cathode used was of a double-cylindrical skeleton structure of 200 mm outer diameter and 300 mm height. The target elements 29 consisted of sixteen round titanium bars of 10 mm diameter. The inner target cathode 105 was of 50 mm diameter and 300 mm height, and included eight round titanium bars as target elements 111 of 5 mm diameter. The magnetron target 81 was of a cylindrical type similar to that in FIG. 3C, in which four titanium pipes of 15 mm diameter and 200 mm height into which cylindrical magnets were incorporated were connected as shown in FIG. 3C. The sputtering was carried out under the following conditions, using argon gas as a discharge sustaining gas:

target cathode voltage: −1.0 kv
magnetron target voltage: −0.25 kv
magnetic flux density of the surface of the magnetron target: 400 gauss
substrate voltage: −0.15 kv
Ar partial pressure: $4 \times 10^{-2}$ torr
sputtering time: 0.5 hour
temperature of the substrates: 450° C.

Formed on the substrates was a compact titanium layer of slight columnar structure of average thickness 2.5 μm.

EXAMPLE 3

A sputtering apparatus substantially shown in FIG. 3A was used, and a copper coating layer was formed on a 20 mm×50 mm×2 mm stainless steel plate. The target cathode used was of a cylindrical skeleton structure of 200 mm outer diameter and 300 mm height, and included sixteen round copper bars as target element of 13 mm diameter. The magnetron target was of a cylindrical type similar to that in FIG. 3C, in which four copper pipes of 15 mm outer diameter and 200 mm height into which cylindrical-type permanent magnets having surface magnetic density of 400 to 430 gauss were incorporated, were connected as shown in FIG. 3C. The sputtering was carried out under the following conditions, using argon gas as a discharge sustaining gas:

target cathode voltage: $-1.0$ kv
magnetron target voltage: $-0.25$ kv
substrate voltage: $-0.4$ kv
Ar partial pressure: $1 \times 10^{-2}$ torr
sputtering time: 0.3 hour
substrate temperature: 320° C.

Formed on the substrate was a compact copper layer of a columnar structure and of average thickness 3.2 μm.

What is claimed is:

1. A sputtering apparatus for applying a coating to an article which apparatus comprises:
   (a) a vacuum chamber;
   (b) a holding means disposed within the vacuum chamber for holding the article; and
   (c) a target cathode disposed within the vacuum chamber, the target cathode being of a tubular skeleton structure disposed in surrounding relation to the article holding means.

2. The sputtering apparatus as recited in claim 1, wherein the cathode target comprises at least four elongated target elements and means for jointing the target elements so that the target elements are vertically erected on a closed curve in a substantially equi-spaced relation to form the tubular skeleton structure, and wherein the target cathode is vertically disposed so as to surround the article holding means.

3. The sputtering apparatus as recited in claim 2, wherein the target elements are erected in intervals of about 5 to about 100 mm, the target elements being spaced from the article by a distance of about 10 to about 100 mm.

4. The sputtering apparatus as recited in claim 3, wherein the target elements are erected in intervals of about 10 to about 30 mm, the target elements being spaced from the article by a distance of about 30 to about 50 mm.

5. The sputtering apparatus as recited in claim 4, wherein the target element is one of rod, pipe, and plate.

6. The sputtering apparatus as recited in claim 5, wherein the jointing means comprises an upper ring and a lower ring, and wherein the target elements are each jointed at opposite ends thereof to the upper and lower rings to thereby form the target cathode of a cylindrical skeleton structure.

7. The sputtering apparatus as recited in claim 6, wherein the target cathode is provided at its inside with additional target elements.

8. The sputtering apparatus as recited in claim 5, wherein the target cathode is provided at its inside with additional target elements.

9. The sputtering apparatus as recited in claim 5, further comprising first target electrodes disposed in a center of the target cathode, the first target electrodes having first means for generating a magnetic field incorporated therein.

10. The sputtering apparatus as recited in claim 9, further comprising a plurality of second target electrodes disposed around and near at least one of an inside and outside of the target cathode in a substantially equi-spaced relation, the second target electrodes each having second means for generating a magnetic field incorporated therein.

11. The sputtering apparatus as recited in claim 5, further comprising a plurality of second target electrodes disposed around and near at least one of an inside and outside of the target cathode in a substantially equi-spaced relation, the second target electrodes each having second means for generating a magnetic field incorporated therein.

12. The sputtering apparatus as recited in any one of claims 1 to 11, further comprising means, provided to the vacuum chamber, for rotating the article holding means.

13. The sputtering apparatus as recited in claim 12, further comprising means, provided to the outside of the target element, for heating the vacuum chamber.

14. A sputtering apparatus for forming a coating on an article to be treated, comprising:
   (a) a vacuum chamber;
   (b) means, disposed within the vacuum chamber, for holding the article;
   (c) a target cathode disposed within the vacuum chamber, the target cathode being of a tubular skeleton structure and disposed in a position to surround the article;
   (d) means for applying a negative voltage to the target cathode;
   (e) means for applying a bias voltage to the article; and
   (f) means for grounding the vacuum chamber to thereby make the chamber an anode.

* * * * *